United States Patent
Vacar et al.

(10) Patent No.: US 7,466,404 B1
(45) Date of Patent: Dec. 16, 2008

(54) TECHNIQUE FOR DIAGNOSING AND SCREENING OPTICAL INTERCONNECT LIGHT SOURCES

(75) Inventors: Dan Vacar, San Diego, CA (US); David K. McElfresh, San Diego, CA (US); Leoncio D. Lopez, Escondido, CA (US); Robert Melanson, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 503 days.

(21) Appl. No.: 11/145,388

(22) Filed: Jun. 3, 2005

(51) Int. Cl.
*G01N 21/00* (2006.01)

(52) U.S. Cl. .................................. 356/237.3

(58) Field of Classification Search .............. 356/237.3, 356/239.8, 237.5; 250/559.41
See application file for complete search history.

(56) References Cited

U.S. PATENT DOCUMENTS

| | | | | |
|---|---|---|---|---|
| 3,508,111 | A * | 4/1970 | Wasula et al. | 257/79 |
| 4,640,002 | A * | 2/1987 | Phillips et al. | 438/12 |
| 5,774,487 | A * | 6/1998 | Morgan | 372/45.01 |
| 5,974,070 | A * | 10/1999 | Haase et al. | 372/49.01 |
| 6,515,740 | B2 * | 2/2003 | Bamji et al. | 356/141.1 |
| 6,670,599 | B2 * | 12/2003 | Wagner et al. | 250/214.1 |
| 6,724,928 | B1 * | 4/2004 | Davis | 382/145 |
| 6,949,473 | B2 * | 9/2005 | Biard et al. | 438/759 |
| 6,979,819 | B2 * | 12/2005 | Adler et al. | 250/307 |
| 6,990,135 | B2 * | 1/2006 | Johnson et al. | 372/96 |
| 2002/0075928 | A1 * | 6/2002 | Genei et al. | 372/49 |
| 2002/0167985 | A1 * | 11/2002 | Shinagawa et al. | 372/50 |
| 2003/0048824 | A1 * | 3/2003 | Shinagawa et al. | 372/46 |
| 2003/0219921 | A1 * | 11/2003 | Biard et al. | 438/38 |

OTHER PUBLICATIONS

McElfresh et al., "Reverse-bias electroluminescence imaging to diagnose failures of vertical-cavity surface-emitting lasers", Jan. 2005, Applied Physics Letters 86, 221108-1, © 2005 American Inst. of Physics.

McElfresh et al., "Reverse-bias emission sheds light on the failure mechanism of degraded vertical-cavity surface-emitting lasers", Jun. 2006, Journal of Applied Physics 99, 123113-1, © American Inst. of Physics.

* cited by examiner

*Primary Examiner*—Tarifur R. Chowdhury
*Assistant Examiner*—Isiaka O Akanbi
(74) *Attorney, Agent, or Firm*—Martine Penilla & Gencarella, LLP

(57) ABSTRACT

A method for testing a substrate by using a photoemission microscope is provided which includes providing the substrate and applying a reverse bias voltage to the substrate. The method further includes detecting light emissions from a top surface of the substrate and characterizing viability of the substrate from the detection of the light emissions.

24 Claims, 9 Drawing Sheets

TECHNIQUE FOR DIAGNOSING AND SCREENING OPTICAL INTERCONNECT LIGHT SOURCES

BACKGROUND

A common light source of optical interconnect modules is the vertical-cavity surface-emitting laser (VCSEL). A VCSEL is a type of semiconductor laser with a beam emission perpendicular to the surface of a semiconductor chip. The reliability of commercially available VCSEL devices has improved substantially during the last decade. Nevertheless, during various burn-in processes or highly accelerated stress tests, the most common mechanism for VCSEL degradation remains the dark line defect (DLD) from dislocations. A variety of techniques was made available to detect degraded (dark) VCSEL devices. Most of these techniques are destructive in nature (cause irreversible changes), which makes them unsuitable as a screening method, and/or make use of elaborate and expensive instrumentation. One testing method is by use of Transmission Electron Microscopy (TEM). Unfortunately, atomic resolution images come at a great cost and the technique is destructive. Another testing method is Thermally Induced Voltage Alteration (TIVA) which could be a non-invasive technique with a relatively good resolution when used with laser scanning microscopy (LSM). Unfortunately, both TEM and LSM remain analysis techniques that are expensive and mostly unavailable to the ubiquitous characterization laboratory.

In view of the foregoing, there is a need for a more efficient and intelligent method of diagnosing and screening optical interconnect light sources that gives high resolution and that is highly cost effective.

SUMMARY

A method for diagnosing and screening optical interconnect light sources is provided. It should be appreciated that the present invention can be implemented in numerous ways, such as a process, an apparatus, a system, a device or a method on a computer readable medium. Several inventive embodiments of the present invention are described below.

A method for testing a substrate by using a photoemission microscope is provided which includes providing the substrate and applying a reverse bias voltage to the substrate. The method further includes detecting light emissions from a top surface of the substrate and characterizing viability of the substrate from the detection of the light emissions.

A computer readable media with program instructions for testing a substrate by using a photoemission microscope is provided. The computer readable media includes program instructions for applying a reverse bias voltage to the substrate. The computer readable media also includes program instructions for detecting light emissions from a top surface of the substrate and program instructions for characterizing viability of the substrate from the detection of the light emissions.

A method for testing a vertical-cavity surface-emitting laser (VCSEL) by using a photoemission microscope is provided which includes providing the VCSEL and applying a reverse bias voltage to the VCSEL. The applying the reverse voltage includes injecting charge carriers into the junction region of the VCSEL. The method further includes detecting light emissions from a top surface of the VCSEL and determining dark line defects from dislocations from the detected light emissions.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

Figure 1A:
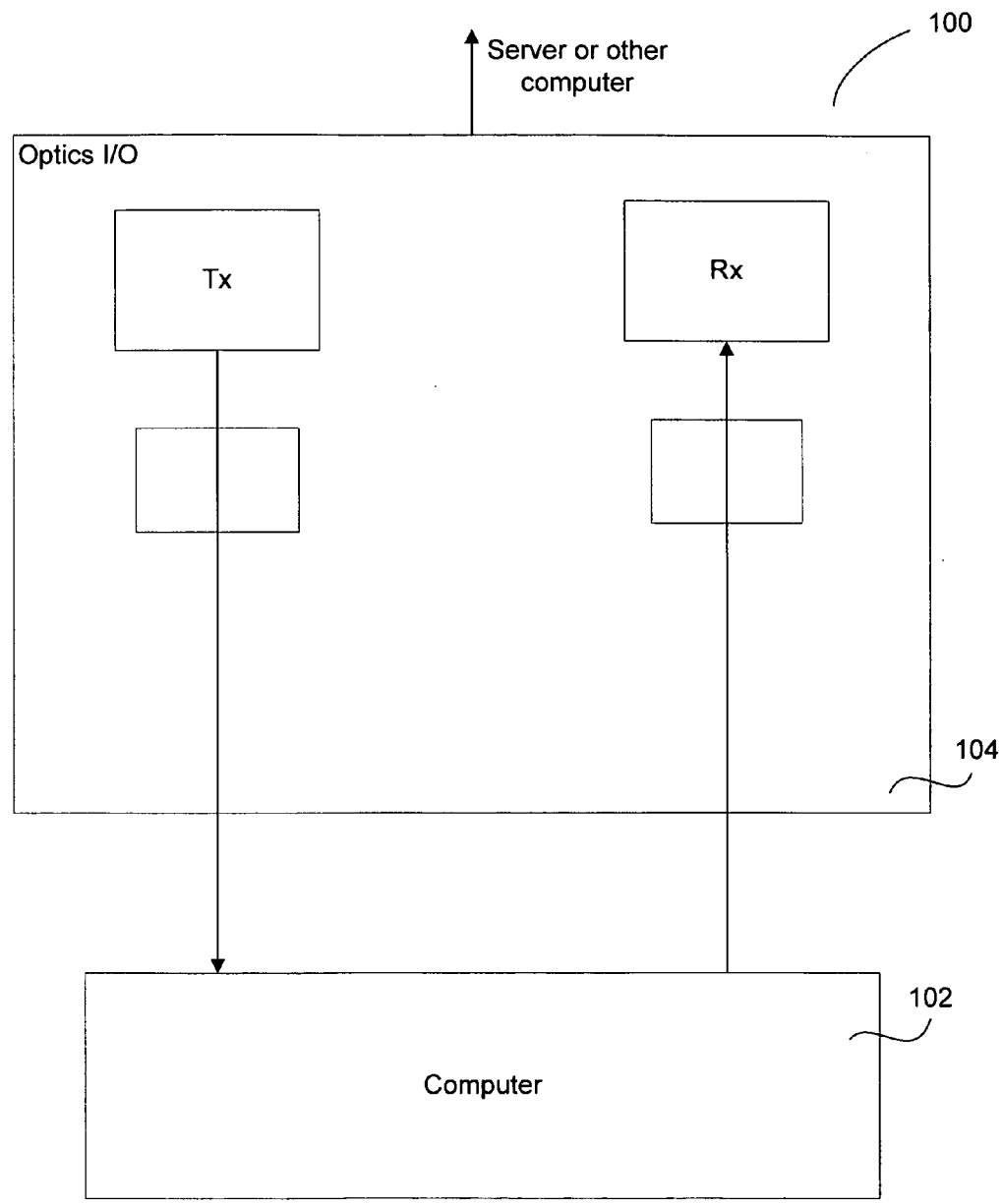
FIG. 1A illustrates a data transmission system where data is sent through an optical transmission module in accordance with one embodiment of the present invention.

An invention is provided for diagnosing and screening optical interconnect light sources. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

In one embodiment, a nondestructive, rapid characterization technique is provided which can use an emission microscope to screen/test a substrate that can emit light such as, for example, a vertical-cavity surface-emitting laser (VCSEL). In general terms, embodiments of the present invention provide for a characterization technique which, in conjunction with optical and electrical tests, directly images the spatial pattern of the dark line defects (DLD) from dislocations responsible for the mechanism of VCSEL degradation. The embodiments described herein include a non-destructive, and inexpensive rapid characterization technique that makes use of an emission microscope (EMMI) to image the spatial pattern of the breakdown electroluminescence (BEL) of the reverse biased VCSEL devices. Therefore, the embodiments of the present invention when used to screen VCSELs enable the detection of problematic and potentially problematic VCSELs.

Existing screening methods generally run/operate devices for extended periods of time (hours, days, weeks, months). In contrast, in one embodiment, the method of the present invention accomplishes screening of VCSELs in real time.

Existing screening methods generally monitor indirect parameters, other than output power. These existing methods check whether these indirect parameters change an acceptable amount or an unacceptable amount. From a reliability standpoint, changes in these indirect parameters are inferred to correlate with the reliability performance of VCSELs. In contrast, in one embodiment of the present invention, the defect directly responsible for the degradation in reliability is directly monitored.

VCSELs are subjected to many screening burn in steps followed by parametric tests. These tests are generally performed under a forward biased condition which narrows the depletion region about the junction region and fails to detect defects near the junction region. In one embodiment of this invention, the method uses reverse bias which enlarges the depletion region about the junction region and thereby detects and/or develops/precipitates defects over more material in the junction region, as opposed to forward bias.

Also, typical screening methods are destructive where parts are run long enough to consume a large fraction of their expected life. In contrast, in one embodiment, the present invention is non-destructive so the parts that are tested can be used after the test. In addition, in one embodiment of the present invention, the method of screening can be applied to 100% of parts because of the fast and non-destructive nature of the screening method. This may give extremely accurate statistics as far as looking for this particular failure mechanism. Morever, if VCSEL failures occur during the fabrication process, an embodiment of the present invention can be inserted at various points in the process flow in order to identify/debug the faulty process step.

Moreover, the embodiments of the present invention can be used as a process control method associated with any fabrication step (in-situ, during the operation, or right after the process step). Additionally, in one embodiment, the method described herein can lend itself to non-destructive failure analysis method for field return VCSELs.

The embodiments of the present invention may also reduce and/or eliminate VCSEL redundancy. Currently certain components/systems contain several redundant VCSELs to protect from possible field degradation. Using the methods described herein, the need for redundancy can be eliminated because the methods of the present invention can directly screen for the defect known to cause failure. The methods herein may be valid for a variety of semiconducting optoelectronic devices. Therefore, as utilized herein VCSELs may be replaced by any suitable type of optoelectronic substrate such as, for example, LED, photodetector, photovoltaic cell, solid state devices, semiconductor devices, etc.

FIG. 1A illustrates a data transmission system 100 where data is sent through an optical transmission module 104 in accordance with one embodiment of the present invention. In such a system, a computer 102 may send optical signals to an optical transmission module 104 which may transmit and receive optical signals. Such an optical transmission module may include a substrate capable of emitting light such as, for example, a VCSEL such as those discussed in reference to FIGS. 3A-4B. In one embodiment, the optical transmission module 104 may be a 12 channel transceiver module.

Figure 1B:
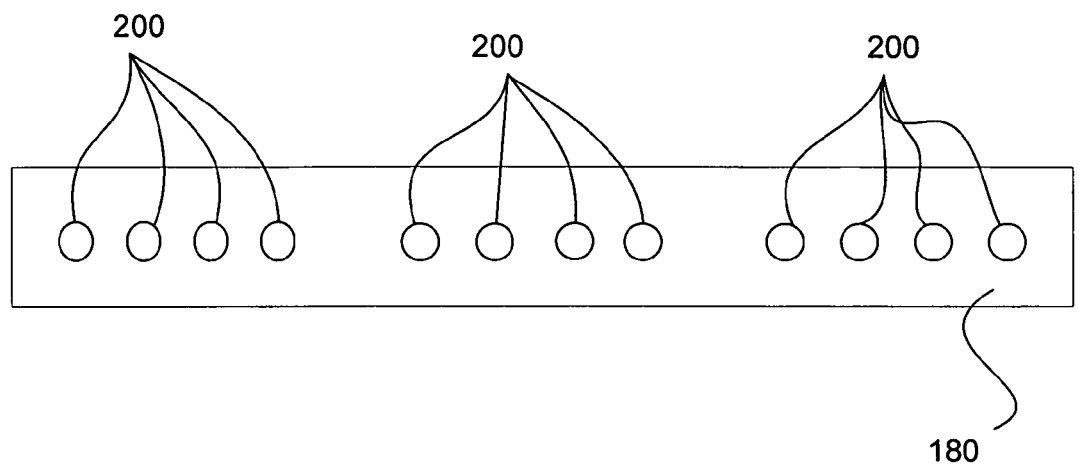
FIG. 1B depicts a VCSEL array in accordance with one embodiment of the present invention.

FIG. 1B depicts a VCSEL array 180 in accordance with one embodiment of the present invention. In one embodiment, the VCSEL array 180 includes 12 VCSELs 200 along 250 micron distance intervals. It should be appreciated the VCSEL array 180 is one of many different embodiments of how the VCSELs 200 can be utilized, configured, and/or oriented to generate light beams for optical communication.

Figure 2:
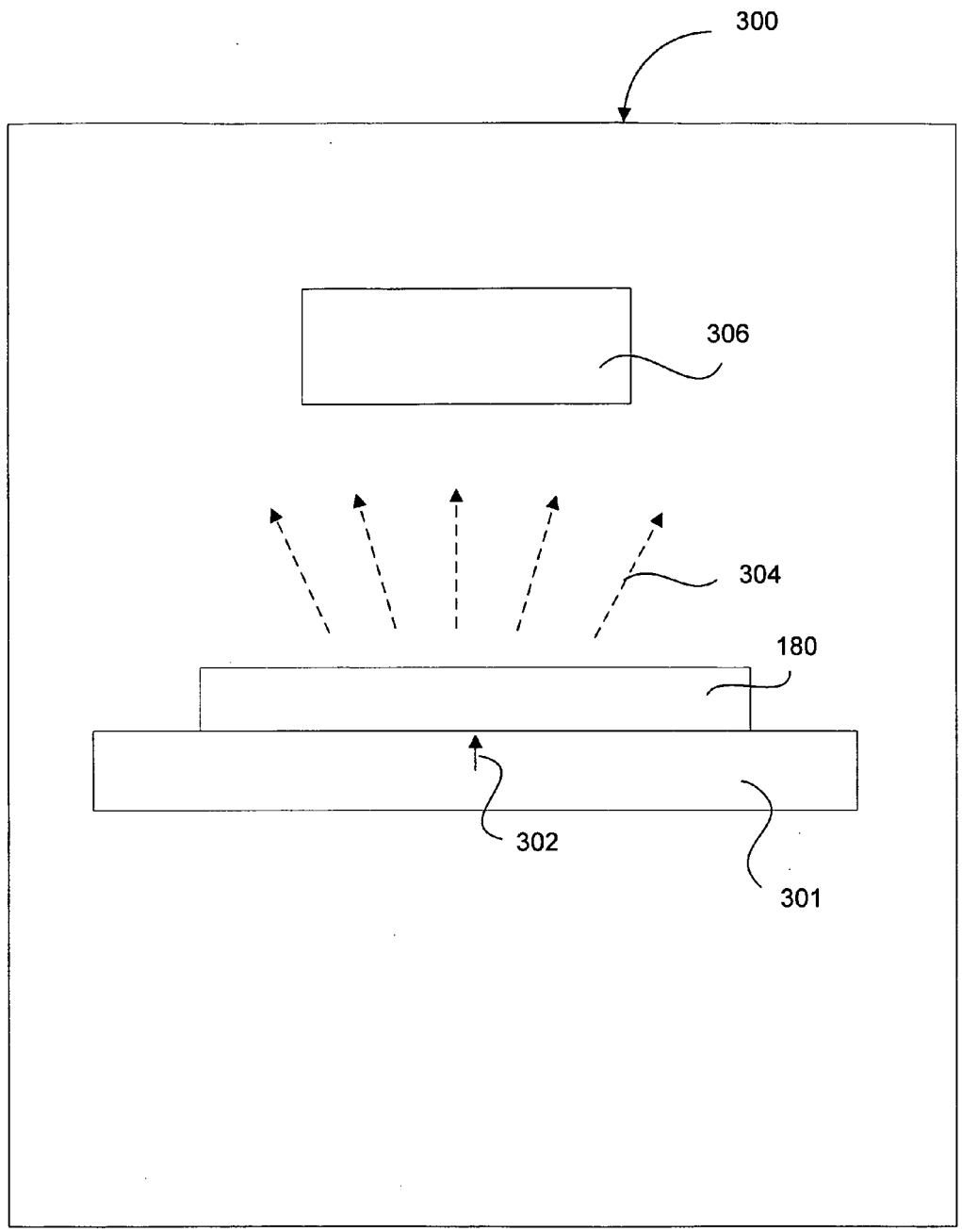
FIG. 2 illustrates an exemplary emission microscope for analyzing the VCSEL array in accordance with one embodiment of the present invention.

FIG. 2 illustrates an exemplary emission microscope 300 for analyzing the VCSEL array 180 in accordance with one embodiment of the present invention. In one embodiment, the emission microscope 300 may be any suitable type and/or configuration of microscope that is capable of implementing the methodology described herein. In one embodiment, an emission microscope may be an infrared-confocal emission microscope such as, for example, the Phemos-1000 made by Hamamatsu Photonics located in Hamamatsu City, Japan. In one embodiment, the VCSEL array 180 may be placed inside the microscope 300 for analysis. The microscope may be utilized so a reverse bias is applied to the VCSEL array 180. Therefore, in such an embodiment, reverse bias voltage 302 from a charge generator 301 may apply charge carriers into the junction region of the VCSEL 200. The charge carriers may interact with the components (e.g., active region, mirrors) within the VCSEL 200 to generate different light outputs 204 which can be detected by light detector 306. The light detector 306 may be any suitable light detection unit that detects light output from a top surface of the VCSEL 200. As discussed in further detail below, the intensity and the area of light output from the top surface of the VCSEL 200 may be utilized to screen problematic VCSELS.

Figure 3A:
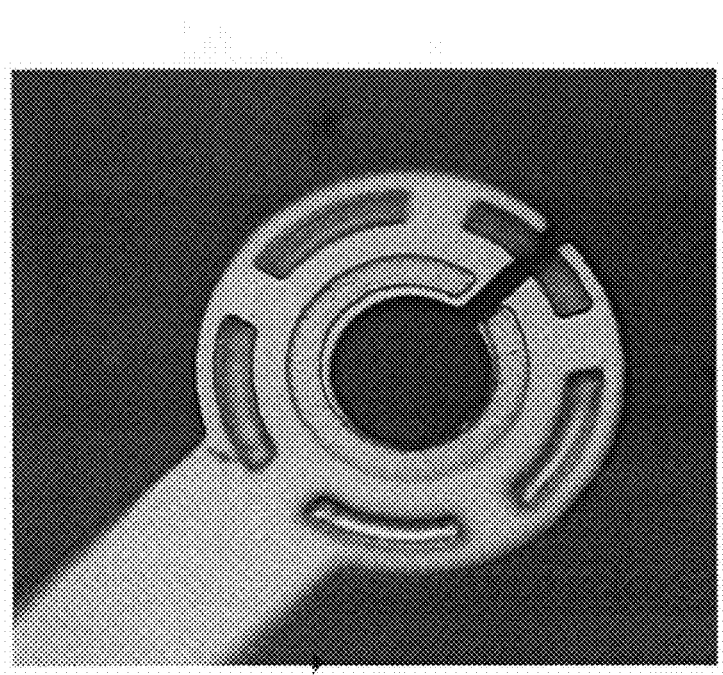
FIG. 3A shows a top view of a trench oxide VCSEL in accordance with one embodiment of the present invention.

FIG. 3A shows a top view of a trench oxide VCSEL 200 in accordance with one embodiment of the present invention. In this embodiment, a structure of the trench oxide VCSEL 200 from the top when no bias voltage is applied is illustrated. The details regarding the structure of the trench oxide VCSEL 200 is described in further detail in reference to FIG. 3B.

Figure 3B:
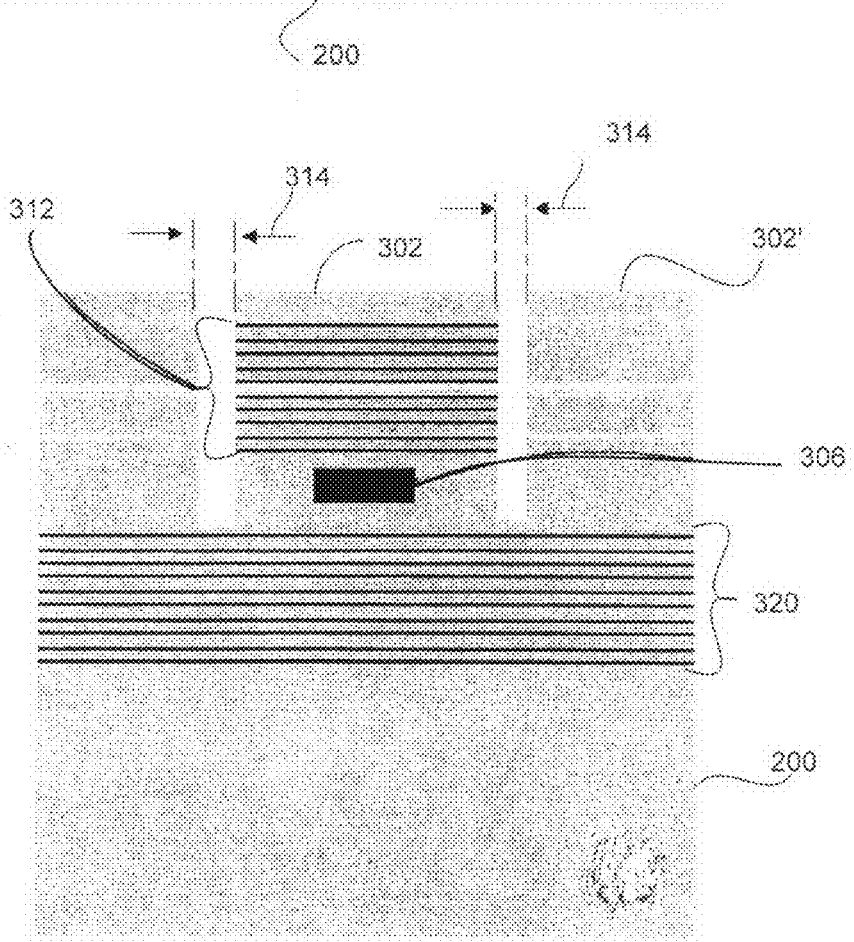
FIG. 3B illustrates a cross-sectional view of the trench oxide VCSEL in accordance with one embodiment of the present invention.

FIG. 3B illustrates a cross-sectional view of the trench oxide VCSEL in accordance with one embodiment of the present invention. In one embodiment, the trench oxide VCSEL includes mirrors 312 defined within a dielectric region 302. The dielectric region 302 also includes an active region 306 which is defined below the mirrors 312 and above back reflectors 320. In one embodiment, the active region 306 is confined by an aluminum oxide region. It should be appreciated that the active region 306 may be any suitable material that can be utilized within a VCSEL to generate light. In one embodiment of the trench oxide VCSEL 200, spaces 314 separate the dielectric region 302 and a dielectric region 302'. In one embodiment, the mirrors 312 and the back reflectors 320 may be Distributed Bragg-Reflector (DBR) mirrors disposed parallel to the VCSEL surface with the active region 306 in between. In one embodiment, the active region 306 may contain quantum-wells for laser light generation.

Figure 4A:
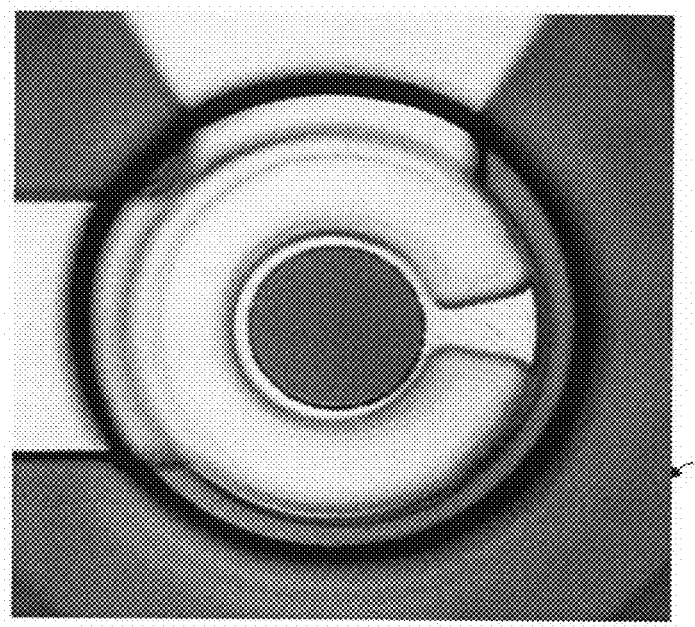
FIG. 4A shows a top surface of a mesa VCSEL in accordance with one embodiment of the present invention.

FIG. 4A shows a top surface of a mesa VCSEL 200' in accordance with one embodiment of the present invention. In this embodiment, a structure of the mesa VCSEL 200' as may be seen from the top when no bias is applied is illustrated. The details regarding the structure of the mesa VCSEL 200' is described in further detail in reference to FIG. 4B.

Figure 4B:
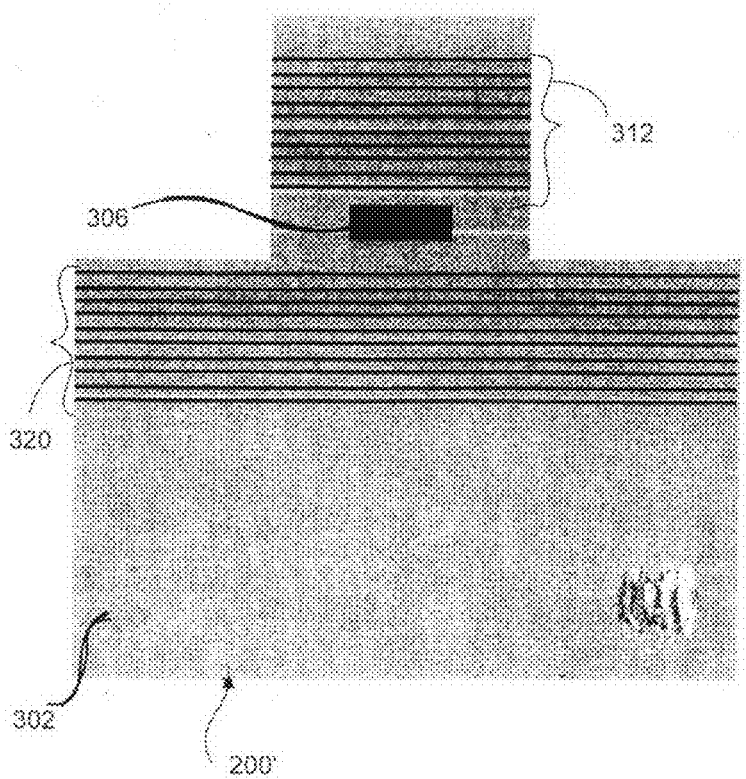
FIG. 4B illustrates a cross-sectional view of a mesa VCSEL in accordance with one embodiment of the present invention.

FIG. 4B illustrates a cross-sectional view of a mesa VCSEL 200' in accordance with one embodiment of the present invention. In one embodiment, the mesa VCSEL 200' includes mirrors 312 defined within a dielectric region 302. The dielectric region 302 also includes an active region 306 which is defined below the mirrors 312 and above back reflectors 320. In one embodiment, the active region 306 is confined by an aluminum oxide region. It should be appreciated that the active region 306 may be any suitable material that can be utilized to generate light. In one embodiment of the mesa VCSEL 200', the structure differs from the trench oxide VCSEL 200 as described in reference to FIGS. 3A and 3B in that the VCSEL 200' does not have the dielectric region 200' of the trench oxide VCSEL 200.

In one embodiment, by analyzing the VCSEL 200/200' in a photo emission microscope, electroluminescence (EL) images may be collected from nondegraded and degraded VCSELs under junction breakdown conditions with a small applied reverse bias. In conjunction with other optical and electrical tests, this new characterization technique directly images the spatial pattern of the DLD network.

The following figures describe samples used during one exemplary experiment consisting of linear arrays of 12-VCSEL devices with a 250-micron near-neighbor separation. The substrates being tested underwent a standard fabrication process: the VCSEL aperture was rendered by a standard trench oxide approach. No dielectric passivation was applied to protect these devices. The arrays were mounted and wire-bonded on ceramic dip packages. The stress that the VCSEL arrays went through consisted of elevated temperature (T=85° C.), relative humidity (85%), and bias (I=8 mA). After an incubation time of hundreds of hours, catastrophic failures occur, consistent with the rapid growth of a DLD network. Often, this network takes tens of minutes from when it is first detectable to when total failure occurs. The samples were pulled out of the environmental chamber and tested at predetermined times: t=0, 48, 169, 500, 1000, . . . hours. The light output as a function of forward current bias was measured for each device (channel) on every VCSEL array. The device degradation was quantified in terms of the relative change in light at operational conditions. FIGS. 5-7D describe methods of testing the VCSELs for light emission degradation and the results obtained from such testing. It should be appreciated that the embodiments shown in FIGS. 5-7D are purely one example of how a VCSEL can be tested by using the present invention and it should further be appreciated that any suitable testing conditions consistent with the methodologies described herein may be utilized.

Figure 5:
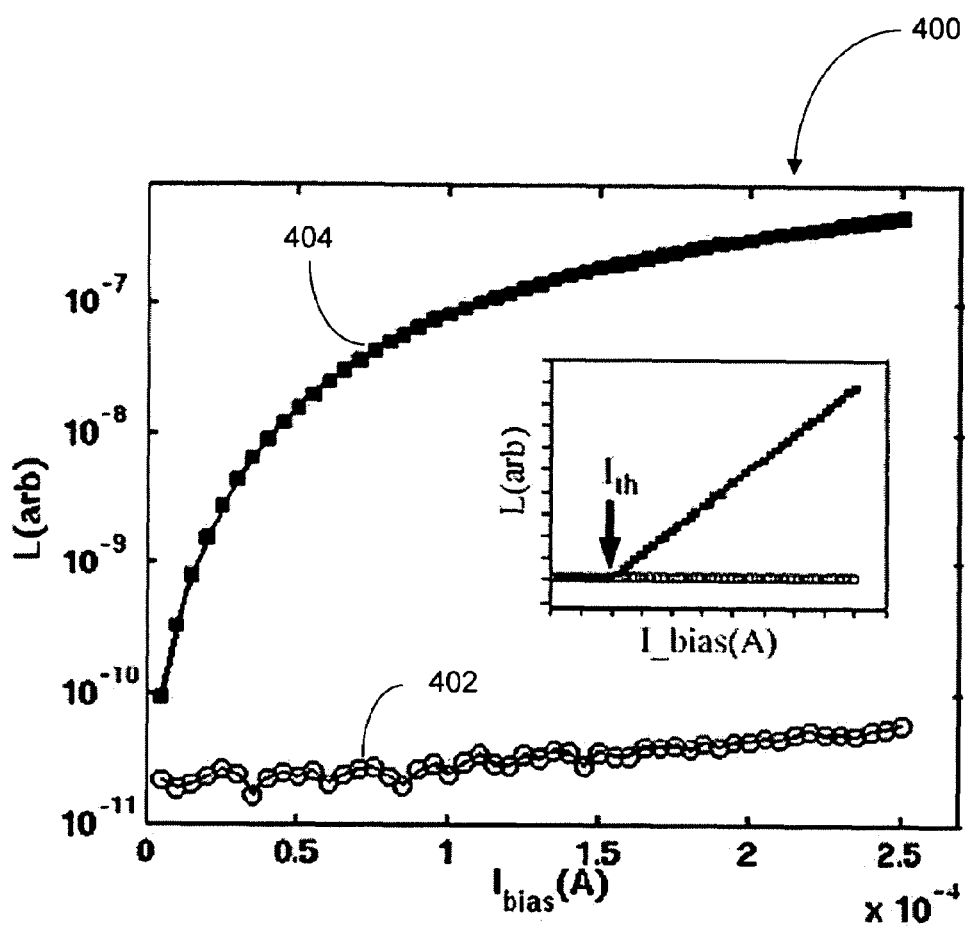
FIG. 5 shows a graph illustrating a spontaneous emission (SE) under forward bias conditions from a degraded VCSEL versus SE of a non-degraded VCSEL in accordance with one embodiment of the present invention.

FIG. 5 shows a graph 400 illustrating spontaneous emission (SE) under forward bias from a degraded VCSEL versus SE of a non-degraded VCSEL in accordance with one embodiment of the present invention. In one embodiment, the graph 400 has an x-axis of bias current versus a y-axis of light output power. As bias current increases, light output power of the SE from the non-degraded VCSEL as shown by line 404 increases. In contrast, as bias current increases, there is no appreciable increase in light output power of the SE from the degraded VCSEL as shown by line 402. Light-current (L-I) and current-voltage (I-V) characteristics were measured. In one embodiment, each channel of the VCSEL array may be turned on successively by an electronic switch and a current source may be swept through the measurement range while the light output from this single channel is collected by a light-tight wide area detector. The inset of FIG. 5 illustrates L-I sweeps taken at t=500 hours for two near neighbor VCSEL devices: Channel 7—dots of line 404, and Channel 8—circles of line 402. The arrow marks the threshold current I=1.5 mA where lasing onsets for Channel 8. In the lasing regime, the light output of this device increases linearly with the bias current. At the same time, no measurable light was emitted by Channel 7 under the designated forward bias range. The main graph in FIG. 5 shows the dependence of the spontaneous emission (SE) for bias currents below 0.25 mA, well under the lasing onset. While the SE of the non-degraded device increases versus bias current, again no measurable light is collected from the degraded VCSEL. The reverse-bias I-V characteristics may be acquired for the two neighboring VCSELs of FIG. 5 by using the test setup described in the previous paragraph.

Figure 6:
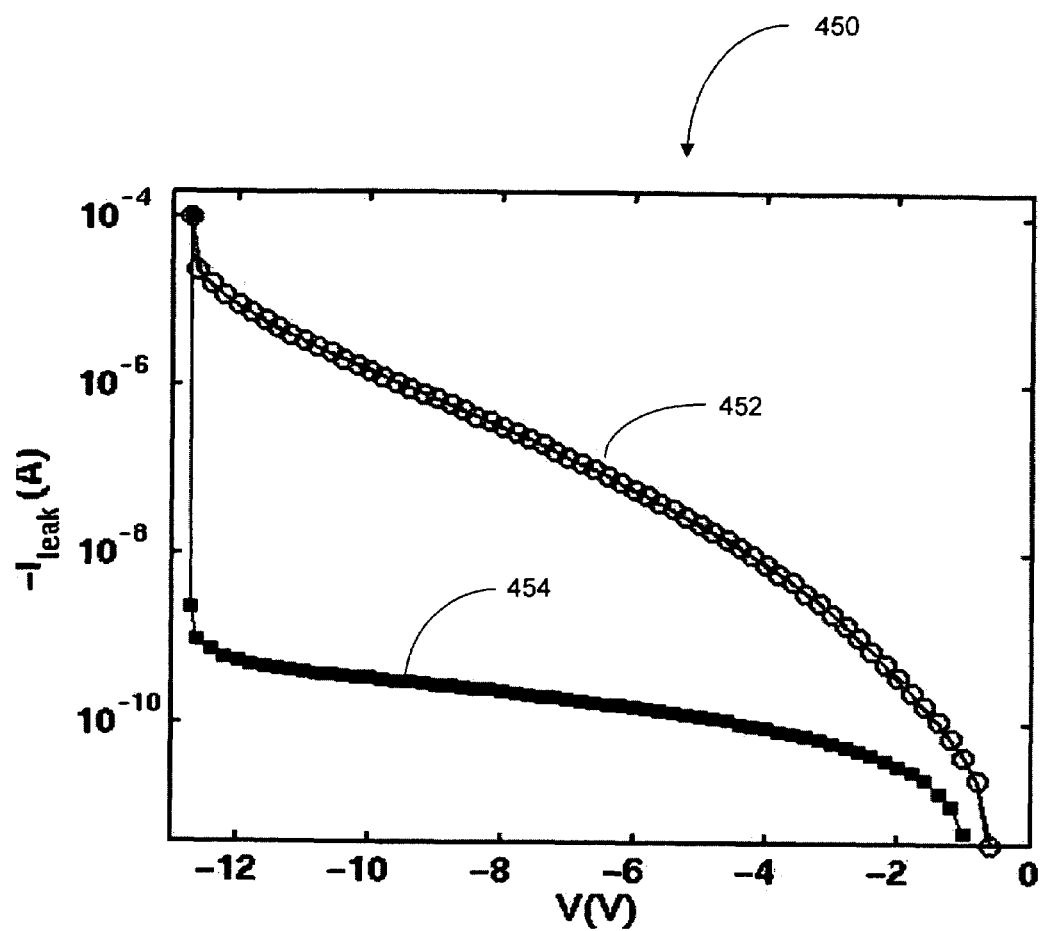
FIG. 6 illustrates a graph that shows leakage current versus reverse bias voltage in accordance with one embodiment of the present embodiment.

FIG. 6 illustrates a graph 450 that shows leakage current versus reverse bias voltage in accordance with one embodiment of the present embodiment. In one embodiment, the graph 450 has an x-axis of voltage versus a y-axis of leakage current. As the reverse bias voltage is increased, leakage current from the degraded VCSEL as shown by line 452 increases. In contrast, as reverse bias voltage increases, there is much less leakage current from the non-degraded VCSEL as shown by line 454. In one embodiment, the graph 450 shows that the junction of the non-degraded device has a relatively low leakage current (less than 1 nA). By comparison, the degraded VCSEL has a very leaky junction. Current flow can be up to 3-4 orders of magnitude larger for the degraded device relative to the non-degraded VCSEL. On the other hand, both devices reach breakdown conditions at around 13V. The larger intensity of the leakage current for the degraded VCSEL is due to physical changes that have occurred in the active region (unction) or in the vicinity of the junction. In order to gain further insight into the mechanism responsible for VCSEL degradation the spatial distribution of the EL may be imaged under two very specific conditions: SE in forward bias (well below lasing onset) and EL in reverse-bias (during junction breakdown).

One exemplary photo-emission microscope that may used to characterize exemplary samples can be a Phemos100 by Hamamatsu with a sensitive Si-CCD camera, liquid cooled to −35° C., and enclosed into a light-tight box. As discussed above, any suitable type of microscope or emission microscope with the proper capabilities to measure the data as described herein may be utilized. The acquisition time for all the images in FIGS. 7A through 7D is t=2s. Each channel of the VCSEL array may be turned on successively via a patch panel and fed with a predefined forward or reverse-bias current. FIGS. 7A through 7D show non-degraded and degraded VCSELs with various biases applied to the VCSELs.

Figure 7A:
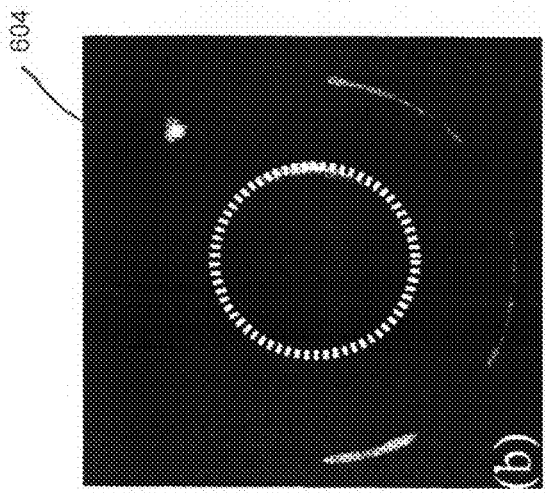
FIG. 7A shows an image of a VCSEL top surface when no bias is applied in accordance with one embodiment of the present invention.

FIG. 7A shows an image 602 of a VCSEL top surface when no bias is applied in accordance with one embodiment of the present invention. There is no visual difference between the appearance of the non-degraded and degraded VCSELs under open circuit conditions (no bias).

Figure 7B:
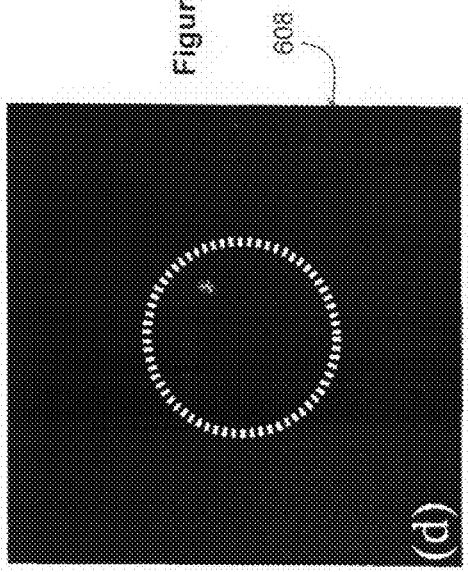
FIG. 7B illustrates a uniform spatial distribution of an SE under forward bias for a non-degraded VCSEL in accordance with one embodiment of the present invention.

FIG. 7B illustrates a uniform spatial distribution 604 of an SE under forward bias for a non-degraded VCSEL in accordance with one embodiment of the present invention. The uniform spatial distribution 604 of the SE for the non-degraded VCSEL is shown when it is driven by I=+4 uA in forward bias. No such SE is detectable for the degraded device. If the anomaly responsible for the lack of lasing only affected the cavity mirrors, another degradation mechanism, there would be an observable SE pattern on this device. This result alongside the data presented in FIG. 5 shows that the defect causing the degradation occurs in the active region of the degraded VCSEL and not on or inside the Bragg reflector layers.

The spatial pattern of light emission may also be imaged while the devices are reverse-biased by a current in the range from I=−0.5 uA to I=−20 uA. These drive conditions correspond to junction breakdown (for the non-degraded VCSEL) or close to the breakdown regime (for the degraded VCSEL).

Figure 7C:
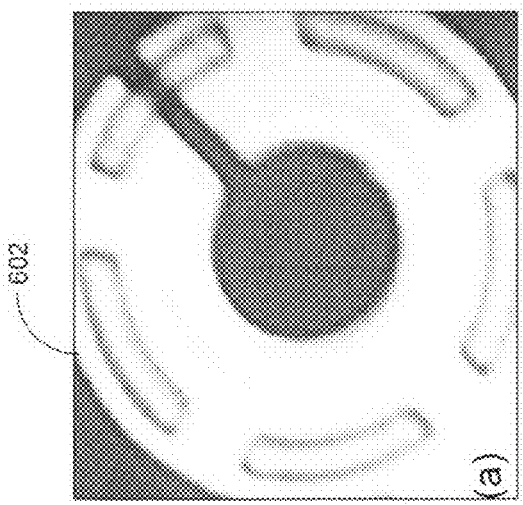
FIG. 7C shows a reverse-bias electroluminescence (EL) of a non-degraded VCSEL in accordance with one embodiment of the present invention.
Figure 7D:
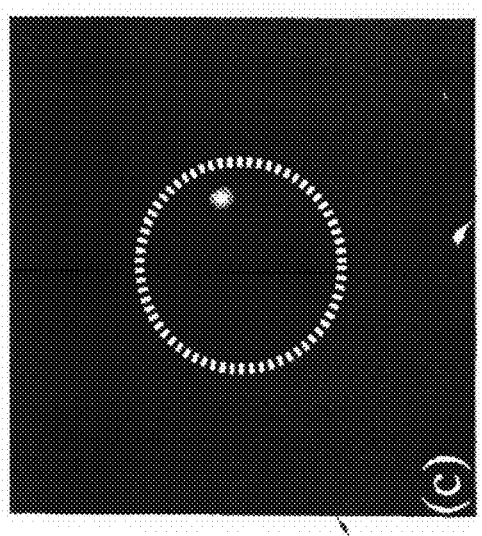
FIG. 7D depicts a reverse-bias EL of a degraded VCSEL in accordance with one embodiment of the present invention.

FIG. 7C shows a reverse-bias EL 606 of a non-degraded VCSEL in accordance with one embodiment of the present invention. The images of FIGS. 7C and 7D show the state of the VCSELs when a current of I=−5 uA is applied, but the respective spatial distributions are independent of the intensity of the breakdown current. FIG. 7C illustrates that for a non-degraded device (of this specific VCSEL design) the breakdown current is spatially localized to one well defined filament.

FIG. 7D depicts a reverse-bias EL 608 of a degraded VCSEL in accordance with one embodiment of the present invention. In contrast to FIG. 7C, FIG. 7D reveals that for the degraded VCSEL the spatial distribution of the breakdown current consists of a disordered network of filaments. The EL originates at recombination centers situated in the vicinity of active region of the VCSEL. These centers provide a disordered lattice where avalanche recombination occurs. The most common cause of VCSEL degradation is the presence of a DLD network in the active region. Therefore, in one embodiment, the spatial pattern of the reverse bias EL as shown in FIG. 7D may image the DLD network. Similar results may be obtained on other fully or partially degraded devices, for various structures of commercially available VCSELs. The junction breakdown conditions do not alter the performance of non-degraded devices nor further degrade the degraded, or partially degraded, VCSELs. The results described herein show the acquiring of reverse-bias EL of VCSEL arrays that has been subjected to temperature and humidity bias stress. The non-degraded devices present breakdown currents confined to one well defined filament while the degraded VCSELs are characterized by reverse bias EL patterns that directly correspond to the DLD network responsible for the degradation mechanism. This non-destructive, inexpensive, and rapid characterization technique can be used to gain insight into the physics of failure of VCSEL devices, regardless of the stress conditions or operating conditions employed.

Figure 8:
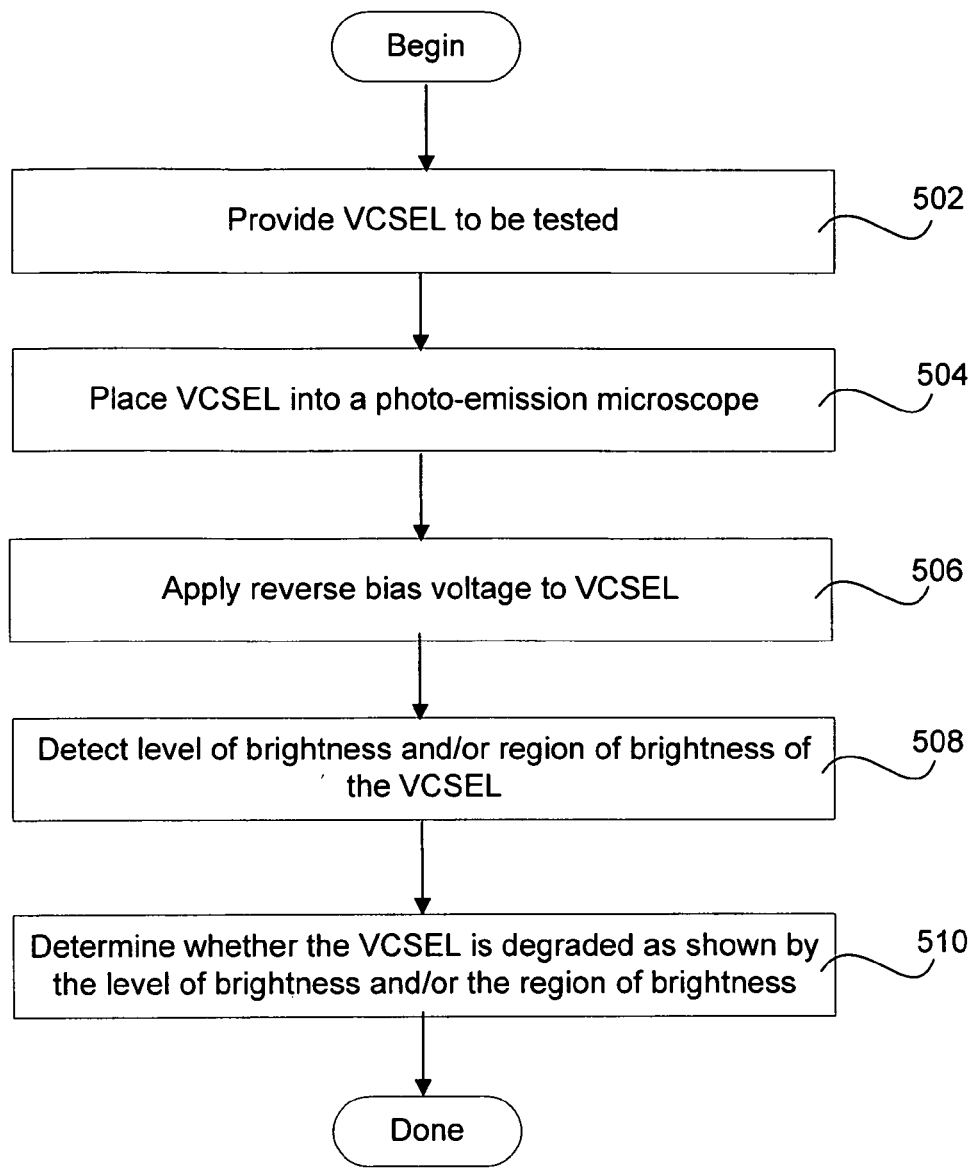
FIG. 8 illustrates a flowchart defining a method for testing a VCSEL in accordance with one embodiment of the present invention.

FIG. 8 illustrates a flowchart 500 defining a method for testing a VCSEL in accordance with one embodiment of the present invention. It should be understood that the processes depicted in the flowchart 500 may be in a program instruction form written on any type of computer readable media. For instance, the program instructions can be in the form of software code developed using any suitable type of programming language. For completeness, the process flow of FIG. 8 will illustrate an exemplary process whereby reverse bias voltage is applied to test whether a VCSEL has degraded.

In one embodiment, the method begins with operation 502 where a VCSEL is provided. It should be appreciated that any suitable substrate that can emit light may be provided for testing using the methodology described herein. After operation 502, the method advances to operation 504 where the VCSEL is placed into a photo emission microscope. In one embodiment, the VCSEL may be placed into a IR-confocal emission microscope for testing. The method then proceeds to operation 506 where reverse bias voltage is applied to the VCSEL. In such an embodiment, charge carriers are injected into the junction region of the VCSEL to provide leakage current to the VCSEL. This produces electroluminescence patterns utilized in further steps of this method. It should be appreciated that any suitable level of reverse bias voltage may be applied to the VCSEL to obtain light emission from a top surface of the VCSEL that would indicate VCSEL degradation. In one embodiment, the reverse bias voltage may be between about 10 V and 13 V. In another embodiment, the reverse bias voltage may be between about 0.5 V and 500V depending on a substrate tested such as, for example, device type (e.g., VCSEL, LED, photodiode, etc.), substrate manufacturer, substrate material, substrate manufacturing method, substrate configuration, etc.

After operation 506, the method moves to operation 508 where level of brightness and/or region of brightness of the VCSEL is measured. In one embodiment, the region and/or level of brightness may determine a DLD network within a VCSEL. Then operation 508 determines whether the VCSEL is degraded as shown by the level of brightness and/or the region of brightness. Therefore, operation 508 may characterize the viability of the VCSEL. For example, a comparison of FIGS. 7C and 7D illustrate that the non-degraded VCSEL under reverse bias voltage shows a distinct and small bright region while the degraded VCSEL shows a large region of differing intensities of light brightness. As described above, typically a large region and level of brightness, as compared with a non-degraded VCSEL, may show evidence of a degraded VCSEL with a DLD network.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, CD-Rs, CD-RWs, magnetic tapes, and other optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for testing a substrate by using a photoemission microscope comprising:

providing the substrate having an active region defined for generating light;

applying a reverse bias voltage to the substrate;
detecting light emissions from the active region of the substrate, the detected light emissions being generated only by defects in the active region of the substrate;
detecting a level of brightness of the light emissions generated by the application of the reverse bias voltage at the active region of the substrate, the detection of the level of brightness of the light emissions including detecting a region of brightness of the substrate; and
characterizing viability of the substrate from the detection of the level of brightness of the light emissions and the region of brightness of the substrate, such that a number of the defects, as detected from the level of brightness of the light emissions caused by only the reverse bias voltage, are indicative of the viability of the substrate.

2. A method for testing a substrate as recited in claim 1, wherein the substrate is one of a vertical cavity surface emitting laser (VCSEL), a light emitting diode (LED), a photodetector, a photovoltaic cell, a solid state device, or a semiconductor device.

3. A method for testing a substrate as recited in claim 1, wherein characterizing viability of the substrate from the light emissions detection includes determining whether the substrate is one of a non-degraded VCSEL, a degraded VCSEL or a VCSEL susceptible to degradation.

4. A method for testing a substrate as recited in claim 2, wherein the VCSEL is one of a trench oxide VCSEL or a mesa VCSEL.

5. A method for testing a substrate as recited in claim 1, wherein applying a reverse bias voltage to the substrate includes applying a reverse bias voltage between about 10 V and 13 V.

6. A method for testing a substrate as recited in claim 1, wherein characterizing viability of the substrate from the light emissions detection includes determining existence of dark line defects from dislocations in the VCSEL.

7. A method for testing a substrate as recited in claim 1, wherein the testing is one of a screen or a process diagnostic.

8. A method for testing a substrate as recited in claim 1, wherein the testing is in real time.

9. A computer readable media with program instructions for testing a substrate by using a photoemission microscope, the computer readable media comprising:
program instructions for applying a reverse bias voltage to the substrate having an active region defined for generating light;
program instructions for detecting light emissions from the active region of the substrate, the detected light emissions being generated only by defects in the active region of the substrate;
program instructions for detecting a level of brightness of the light emissions generated by the application of the reverse bias voltage at the active region of the substrate, the detection of the level of brightness of the light emissions including detecting a region of brightness of the substrate; and
program instructions for characterizing viability of the substrate from the detection of the level of brightness of the light emissions and the region of brightness of the substrate, such that a number of the defects, as detected from the level of brightness of the light emissions caused by only the reverse bias voltage, are indicative of the viability of the substrate.

10. A computer readable media as recited in claim 9, wherein the substrate is one of a Vertical Cavity Surface Emitting Laser (VCSEL), a light emitting diode (LED), a photodetector, a photovoltaic cell, a solid state device, or a semiconductor device.

11. A computer readable media as recited in claim 9, wherein program instructions for characterizing viability of the substrate from the light emissions detection include program instructions for determining whether the substrate is one of a non-degraded VCSEL, a degraded VCSEL, or a VCSEL susceptible to degradation.

12. A computer readable media as recited in claim 10, wherein the VCSEL is one of a trench oxide VCSEL or a mesa VCSEL.

13. A computer readable media as recited in claim 9, wherein applying a reverse bias voltage to the substrate includes applying a reverse bias voltage between about 10 V and 13 V.

14. A computer readable media as recited in claim 9, wherein program instructions for characterizing viability of the substrate from the light emissions detection include program instructions for determining existence of dark line defects from dislocations from the light emissions.

15. A computer readable media as recited in claim 9, wherein the testing is one of a screen or a process diagnostic.

16. A computer readable media as recited in claim 9, wherein the testing is in real time.

17. A method for testing a vertical cavity surface emitting laser (VCSEL) by using a photoemission microscope comprising:
providing the VCSEL having an active region defined for generating light;
applying a reverse bias voltage to the VCSEL, the applying the reverse voltage including injecting charge carriers into a junction region of the VCSEL;
detecting light emissions from the active region of the VCSEL, the detected light emissions being generated only by defects in the active region of the VCSEL;
detecting a level of brightness of the light emissions generated by the application of the reverse bias voltage at the active region of the substrate, the detection of the level of brightness of the light emissions including detecting a region of brightness of the substrate; and
determining dark line defect dislocations from the detected level of brightness of the light emissions and the region of brightness of the substrate, such that a number of the defect dislocations, as detected from the region of brightness of the substrate and the level of brightness of the light emissions caused by only the reverse bias voltage, are indicative of a viability of the VCSEL.

18. A method for testing a substrate as recited in claim 17, wherein applying a reverse bias voltage includes applying a reverse bias voltage between about 10 V to about 13 V.

19. A method for testing a substrate as recited in claim 17, wherein the VCSEL is one of a trench oxide VCSEL or a mesa VCSEL.

20. A method for testing a substrate as recited in claim 17, wherein the substrate is one of a vertical cavity surface emitting laser (VCSEL), a light emitting diode (LED), a photodetector, a photovoltaic cell, a solid state device, or a semiconductor device.

21. A method for testing a substrate as recited in claim 17, wherein characterizing viability of the substrate from the light emissions detection includes determining whether the substrate is a non-degraded VCSEL or a degraded VCSEL or a VCSEL susceptible to degradation.

22. A method for testing a substrate as recited in claim 17, wherein characterizing viability of the substrate from the light emissions detection includes determining existence of dark line defects from dislocations in the VCSEL.

23. A method for testing a substrate as recited in claim 17, wherein the testing is one of a screen or a process diagnostic.

24. A method for testing a substrate as recited in claim 17, wherein the testing is in real time.

* * * * *